United States Patent [19]
Adkins et al.

[11] Patent Number: 6,072,375
[45] Date of Patent: Jun. 6, 2000

[54] WAVEGUIDE WITH EDGE GROUNDING

[75] Inventors: Calvin L. Adkins, Malabar; Donald K. Belcher, West Melbourne, both of Fla.

[73] Assignee: Harris Corporation, Palm Bay, Fla.

[21] Appl. No.: 09/076,422

[22] Filed: May 12, 1998

[51] Int. Cl.[7] .................................................. H01P 3/08
[52] U.S. Cl. ............................. 333/1; 333/238; 333/246
[58] Field of Search ................................ 333/1, 238, 246

[56] References Cited

U.S. PATENT DOCUMENTS

| | | | |
|---|---|---|---|
| 2,926,317 | 2/1960 | Blitz | 333/238 |
| 3,398,232 | 8/1968 | Hoffman | 174/254 |
| 4,362,899 | 12/1982 | Borrill | 174/36 |
| 4,513,266 | 4/1985 | Ishihara | 333/238 |
| 4,605,915 | 8/1986 | Marshall et al. | 333/238 |
| 4,673,904 | 6/1987 | Landis | 333/238 |
| 4,868,716 | 9/1989 | Taylor et al. | 361/818 |
| 4,954,929 | 9/1990 | Baran | 361/794 |
| 5,150,088 | 9/1992 | Virga et al. | 333/238 |
| 5,278,727 | 1/1994 | Westbrook et al. | 361/792 |
| 5,331,514 | 7/1994 | Kuroda | 361/760 |
| 5,334,800 | 8/1994 | Kenney | 174/35 R |
| 5,455,393 | 10/1995 | Ohshima et al. | 174/250 |
| 5,473,112 | 12/1995 | Doi | 174/35 R |
| 5,587,920 | 12/1996 | Muyshondt et al. | 174/260 X |
| 5,677,515 | 10/1997 | Selk et al. | 174/255 |

FOREIGN PATENT DOCUMENTS 21665  2/1980  Japan ..................................... 333/238

*Primary Examiner*—Benny Lee
*Attorney, Agent, or Firm*—Allen, Dyer, Doppelt, Milbrath & Gilchrist, P.A.

[57] ABSTRACT

A waveguide structure and associated method for forming the waveguide structure is disclosed. The waveguide structure is formed from at least two dielectric layers having opposing, substantially planar faces and an intermediate signal path layer positioned between the faces. A conductive layer is formed on each of the opposing, substantially planar faces to form outer ground planes. At least one controlled impedance signal track is formed at the intermediate signal path layer. A plurality of conductive vias extend through the dielectric layers and interconnect the ground planes. The vias form a "sea" of vias, which provide enhanced waveguide mode rejection. A plurality of grounding lines interconnect the vias at the intermediate signal path layer. A conductive via is connected to all adjacent conductive vias outside the controlled impedance signal track to form an inner grounding line grid that is coplanar with the controlled impedance signal track for waveguide mode rejection. The waveguide structure can be formed from two dielectric layers laminated together, and the grounding lines and controlled impedance signal track can be formed by using standard photolithography methods consisting of substrate etching and/or additive processes.

48 Claims, 3 Drawing Sheets

WAVEGUIDE WITH EDGE GROUNDING

FIELD OF THE INVENTION

This patent application relates to the field of waveguides, and more particularly, to a waveguide structure having at least one controlled impedance signal track positioned between outer ground planes.

BACKGROUND OF THE INVENTION

High performance, radio frequency interconnects must be built in production quantities in order to allow engineers to experiment with different designs and determine design efficiency for various circuits. These interconnects also provide the technology for connecting high performance radio frequency interconnects such as used at microwave frequencies. Many designers use "waffle-line" technology that allows high performance radio frequency interconnects. Waffle-line is predominantly formed of metal and provides a natural shielding medium to radio frequencies and especially those radio frequencies at the microwave level. Energy is propagated along "tunnels" made of the metal "waffle" structures, and the insulated wire contained in these structures serve as a microwave or other radio frequency conductor. However, waffle-line is expensive to manufacture and demands a high labor input during manufacture and in the initial production set-up.

It is known that printed dielectric layer technology and other similar dielectric materials can be less expensive than waffle-line technology. However, dielectric layers are predominantly non-conductive and do not provide adequate shielding to any microwaves. Thus, it is difficult to form a shielded conduit for the microwaves Strip line, on the other hand, is typically formed on dielectric layers and other similar dielectric materials and includes two ground planes that act to shield the microwaves. However, even with this type of structure, conductor edges are open and form an internal "space" that can excite other modes and/or couple to other conductors.

Some strip line shielding structures for dielectric layers and other strip line conductors have used conductive columns to interconnect the ground planes. Examples includes U.S. Pat. No. 4,513,266 to Ishihara and U.S. Pat. No. 5,150,088 to Virga, et al. However, these devices do not appear to be adequate for all microwave frequencies used in a conductor, where adequate edge grounding between two ground planes would be necessary.

SUMMARY OF THE INVENTION

It is therefore an object of the present invention to provide a waveguide structure that includes at least one controlled impedance signal track positioned between opposing ground planes, which has sufficient edge grounding for use of the waveguide structure at a range of microwave frequencies.

It is still another object of the present invention to provide a waveguide structure formed from dielectric layers having at least one controlled impedance signal track positioned between dielectric layers, but also at least one controlled impedance signal track and sufficient edge grounding for a range of microwave and millimeter frequencies.

The present invention is advantageous because it now provides a waveguide structure that can be formed from dielectric layers. The waveguide not only includes conductive layers forming outer ground planes, but also has sufficient edge grounding for use at microwave and millimeter frequencies. The waveguide structure includes a controlled impedance signal track.

In accordance with the present invention, the waveguide structure has opposing, substantially planar faces and an intermediate signal path layer positioned between the faces. A conductive layer is formed on each of the opposing, substantially planar faces to form outer ground planes that oppose each other and act as a shield along the parallel faces. At least one controlled impedance signal track is formed at the intermediate signal path layer. A plurality of conductive vias form a "sea" of vias that extends through the dielectric layers and interconnect the ground planes.

A plurality of grounding lines interconnect the vias at the intermediate signal path layer. A conductive via is connected to all adjacent conductive vias outside the controlled impedance signal track to form an inner grounding line grid that is coplanar with the controlled impedance signal track that works in conjunction with the plurality or "sea" of vias for waveguide mode rejection. The controlled impedance signal track can be formed as a split branch controlled impedance signal track or as a number of separate controlled impedance signal tracks. The grounding lines are coplanar with the controlled impedance signal tracks such that the grounding lines and conductive vias establish the edge grounding that not only enhances waveguide mode rejection, but also enhances shielding between various controlled impedance signal tracks.

In one aspect of the present invention, the grounding lines are formed as a continuous edge grounding line adjacent the signal path. The optimum spacing of the conductive vias is dependent on the frequency of interest For example, the conductive vias could be positioned 150 mils apart to provide waveguide mode rejection for 10–20 GHz. However, this is only one example and other dimensions can be used allowing an even greater range of frequencies for waveguide mode rejection, including as low as 1 GHz and below.

In still another aspect of the present invention, the waveguide structure comprises two dielectric layers that are laminated together. Each dielectric layer has a ground layer positioned on one side thereof to form the ground planes. The grounding lines can be formed as etched circuit connections. At least one controlled impedance signal track and any other controlled impedance signal tracks can be formed as an etched controlled impedance signal track.

In still another aspect of the present invention, the waveguide structure further comprises at least two intermediate signal path layers. The signal path is formed to cross-over from one intermediate signal path layer to the other intermediate signal path layer. The grounding lines interconnect the vias at each of the intermediate signal path layers to form a grid that is coplanar with each of the intermediate signal path layers and signal paths. The two intermediate signal path layers can be formed by having another layer or series of layers positioned between two outer dielectric layers.

The dielectric layers can be formed from a number of different materials, such as typically used for dielectric layer construction, including filled Teflon. The conductive vias can be formed as plated through holes. The conductive vias can also be filled with a solid conductive material.

In still another aspect of the present invention, the waveguide structure can comprise three or more dielectric layers forming a body having opposing ground planes, and at least one signal path formed between opposing ground planes. The signal path has edge portions. The conductive vias extend through the dielectric layers at least adjacent the signal path and interconnect the ground planes. The ground planes interconnect the conductive vias that are positioned adjacent the signal path to form a continuous grounding line adjacent the edge of the signal path.

A method aspect of the present invention forms a waveguide structure by the steps of forming a controlled impedance signal track on an intermediate signal path layer. The method further comprises forming a grid of grounding lines on the intermediate signal path layers such that the grid of grounding lines extends outside the signal path. The method further comprises positioning two outer dielectric layers in juxtaposition to the intermediate signal path layer such that the first and second dielectric layers form a waveguide structure, wherein the outer dielectric layers each include an outer ground layer forming a ground plane. The method further comprises forming a plurality of conductive vias within the formed waveguide structure and which extend through the dielectric layers and interconnect the ground planes. The conductive vias are formed to extend through the intersection of the grounding lines.

In accordance with the method aspect of the invention, the method further comprises the step of forming the grounding lines by etching circuit connections. The method also comprises the step of forming the signal path by etching the signal path. Additive processes can also be used. The conductive vias can be formed by plated through holes. The method can also comprise the step of filling the holes with a solid conductive material. The holes can be formed by one of laser forming, plasma etching, mechanical drilling or water jet. The method also comprises the step of spacing the intersection of the grounding lines to enhance waveguide mode rejection for microwave and millimeter wave frequency ranges. The method further comprises the step of forming a continuous edge ground line about the signal path. The method also comprises the step of positioning at least a third dielectric layer between the outer dielectric layers and forming a multilevel signal path.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout the different figures and may not be all described in detail for all figures.

The present invention now provides a waveguide structure that is advantageous over previous "waffle-line" technology. The waveguide of the present invention now provides for high performance radio frequency (e.g., microwave) interconnects that can be built in a batch process for production line quantities. By using multilayer dielectric technology, such as the use of non-conductive dielectric layers, printed dielectric and/or circuit layer technology and low cost lithographic fabrication processes can be used.

With the present invention, energy is conducted in an intermediate signal path layer between two ground planes by at least one controlled impedance signal track formed at the intermediate signal path layer. The invention is particularly useful for strip line and similar microstrip transmission lines, where a flat conductor is positioned between two ground planes, or a conductive circuit is positioned between ground planes. With this type of system, low cost production can be provided in large volumes, and components such as resistors and integrated circuits can be mounted on top of the circuit.

Figure 1:
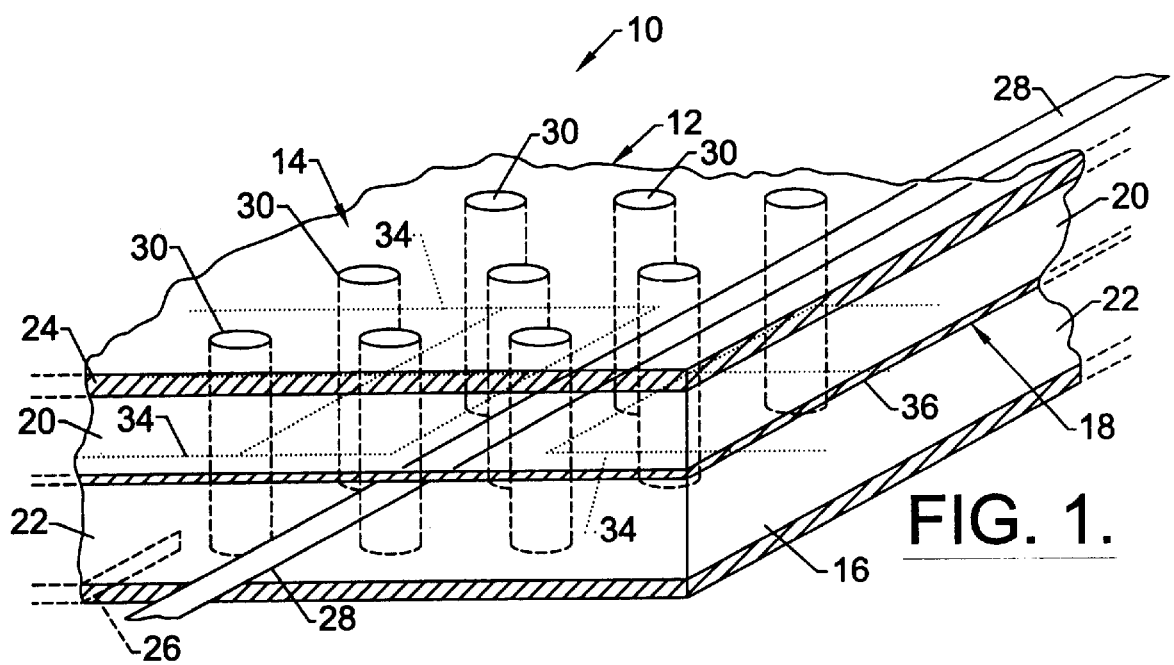
FIG. 1 is a schematic isometric view of the waveguide structure of the present invention showing two opposing ground planes, conductive vias, parallel, interconnected grounding lines, and a controlled impedance signal track formed within the waveguide structure between the ground planes.
Figure 2:
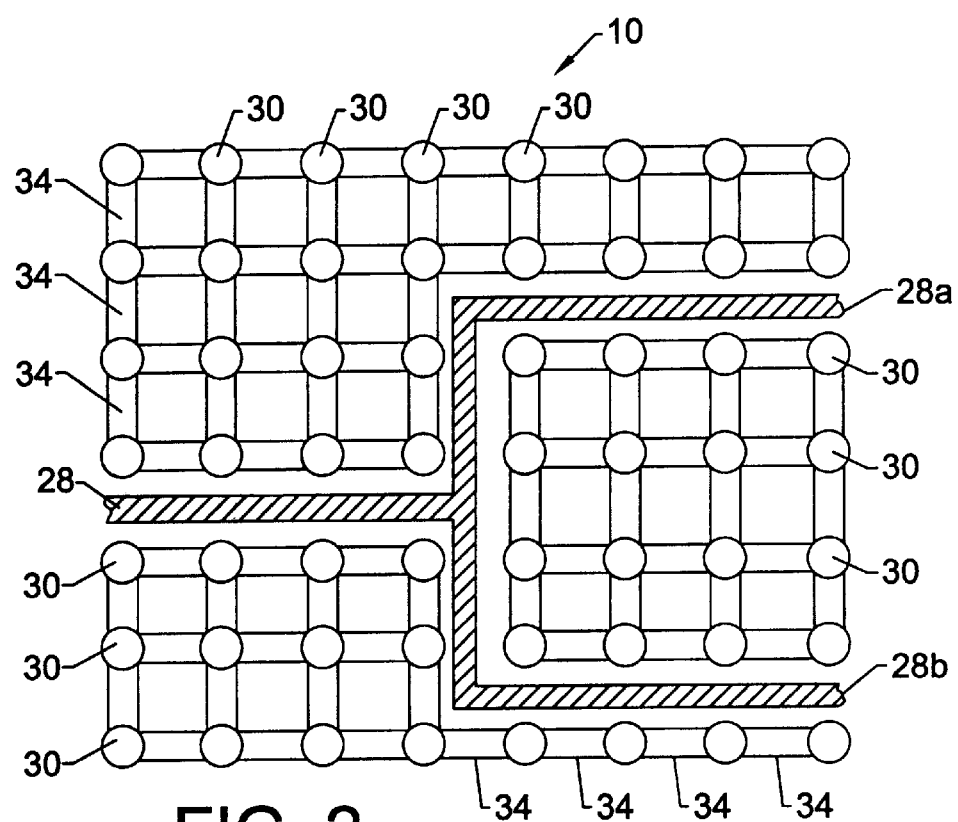
FIG. 2 is a plan view of a grounding scheme for a controlled impedance signal track that splits into two controlled impedance signal tracks.

Referring now to FIGS. 1 and 2, there is illustrated generally at 10 a waveguide structure of the present invention. As best seen in FIG. 1, the waveguide structure 10 is formed from a body 12 having respective opposing, substantially planar faces 14,16 and an intermediate signal path layer 18 positioned between the opposing faces. The body 12 can typically be formed from two respective dielectric layers 20,22 that can be laminated together or secured by appropriate means known to those skilled in the art. A typical example of a conductive layer that can be used in the present invention includes a layer that can be lithographically processed, such as by patterning and etching. Each dielectric layer includes a respective ground layer 24,26 positioned on one side thereof to form respective ground planes as illustrated in FIG. 1.

Figure 4:
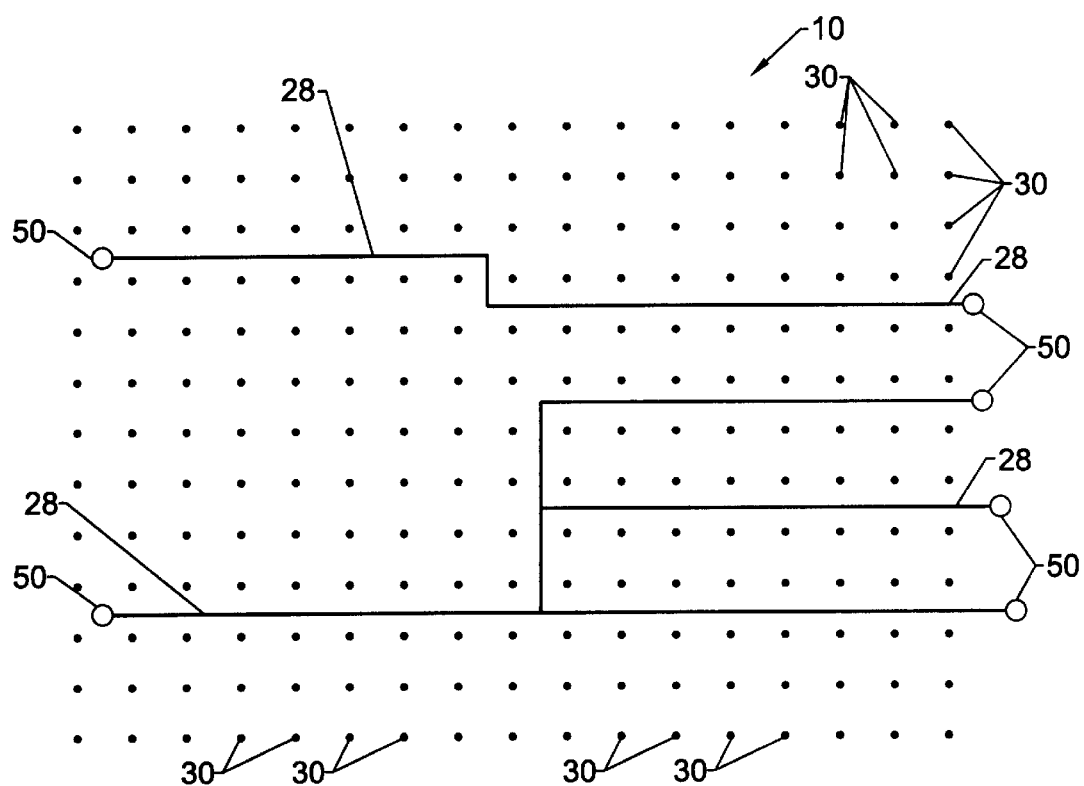
FIG. 4 is a schematic plan view of a portion of the waveguide structure showing various controlled impedance signal tracks and the position of vias without showing in detail the grounding lines.

A controlled impedance signal track 28 is formed at the intermediate signal path layer 18 and typically can be formed by etching using standard photolithography methods or by using additive processes. The controlled impedance signal track 28 forms the path for the transmitted microwave radio frequencies. As shown in FIG. 2, the controlled impedance signal track 28 can be formed as more than one controlled impedance signal track 28 where the controlled impedance signal track splits into two component controlled impedance signal tracks 28a, 28b. FIG. 4 illustrates a schematic plan view where more than one controlled impedance signal track 28 is illustrated. Typically, depending on the size of the body 12, the waveguide typically may include more than one controlled impedance signal track 28.

The waveguide structure is formed from dielectric layers. Its overall size can vary depending on end use, but typically will be about 18" by 18", giving a worker enough room to conduct production radio frequency work, but also provide a waveguide structure that is not unduly large so that it can be manually handled with little difficulty.

The dielectric layers can be formed from a number of different dielectric materials, and can include the appropriate conductive coatings. These materials can include random or woven glass Teflon, ceramic filled Teflon, ceramic thermoset resins, glass reinforced hydrocarbon/ceramic resins, glass reinforced organic/ceramic resins, filled Teflon materials known to those skilled in the art, and other similar materials known to those skilled in the art.

As illustrated in FIGS 1 and 2, a plurality of conductive vias 30 form a "sea" of vias and extend through the dielectric layers and interconnect the ground planes 24,26. The conductive vias 30 can be formed as plated through holes, where the initial holes formed by laser drilling, plasma etching, water jet or other techniques known to those skilled in the art after the various dielectric layers have been secured or laminated together. A conductive material, such as copper, could be used to form vias to connect the two ground planes 24,26. Additionally, in still another aspect of the present invention, the conductive vias 30 can be filled with a solid conductive material 32*a* (FIG. 3), such as a copper and epoxy resin, to provide the electrical connection between the two ground planes 24,26. In some instances, gold could also be used. However, the use of gold may not be economically feasible in production quantities.

As illustrated in FIG. 2, a plurality of grounding lines 34 interconnect the conductive vias 30 at the intermediate signal path layer 18 (see FIG. 1). A conductive via 30 is connected to all adjacent conductive vias 30 outside the controlled impedance signal track 28 to form a grid of inner grounding lines that is coplanar with the controlled impedance signal track to work in conjunction with the plurality or "sea" of vias for waveguide mode rejection (FIG. 2). In the broken isometric view of FIG. 1, the controlled impedance signal track 28 is shown by the solid/dashed horizontal line extending from left to right through the intermediate signal path layer 18. The grounding lines 34 are shown by the dotted lines extending throughout the intermediate signal path layer.

The grounding lines 34 are formed on the intermediate signal path layer before the dielectric layers are secured together. As with the controlled impedance signal tracks 28, standard photolithographic methods (e.g., etching of the grounding lines), and additive processes can be used. Thus, it is evident that the grounding lines and controlled impedance signal tracks are established before the waveguide substrate is completed and can be formed by standard photolithographic techniques known to those skilled in the art, including subtractive or additive photolithographic processes. As is conventional, a copper-clad laminate receives a printed configuration with an acid resist on a foil surface. Etching removes the unwanted surface areas leaving the foil pattern of the controlled impedance signal track and grounding lines. It should be understood that the controlled impedance signal track 28 and grounding lines 34 can be formed on a thin film layer 36 (FIG. 1) sandwiched between two dielectric layers containing the ground plane. The choice of substrate and method will vary depending on end use and the selections of those skilled in the art.

During manufacture, the various substrates and components are formed, e.g., (1) dielectric layers 20,22; (2) the intermediate substrate or thin film layer (if any) having the controlled impedance signal track and grounding lines; and (3) the outer ground layers 24,26. Once these layers are completed, they are secured together, such as by lamination techniques known to those skilled in the art. The conductive vias 30 are then formed as plated through holes, so that the vias extend through the intersection points of the grounding lines as shown in FIG. 2. The conductive vias can be positioned depending on the frequencies used. The spacing can allow waveguide mode rejection for microwave and millimeter wave frequency ranges.

Figure 5:
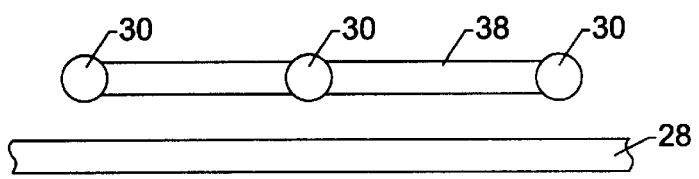
FIG. 5 is an enlarged plan view of a portion of the controlled impedance signal track and grounding line that forms a continuous edge adjacent the controlled impedance signal track.
Figure 5:
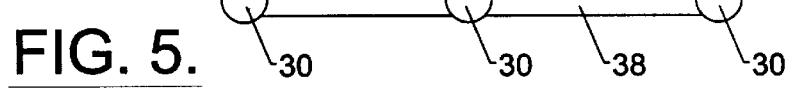

In one aspect of the present invention, the conductive vias are positioned adjacent to the controlled impedance signal track 28 and the grounding lines interconnect the conductive vias 30 to form an edge ground 38 (see FIG. 5) that is positioned adjacent the controlled impedance signal track. Although the single illustrated edge ground 38 could be sufficient for providing waveguide mode rejection, the present invention envisions the illustrated grid pattern of grounding lines as illustrated in FIG. 2. It should be understood that a requisite number of holes forming a "sea" or large plurality of holes can be used and provide waveguide mode rejection.

Figure 6:
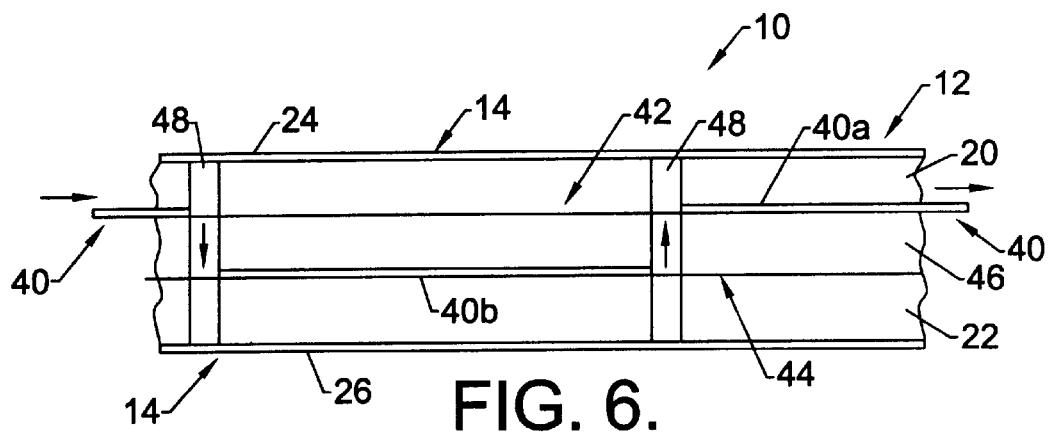
FIG. 6 is a sectional view of a waveguide structure formed from three dielectric layers, and showing two intermediate signal path layers connected by conductive vias.
Figure 7:
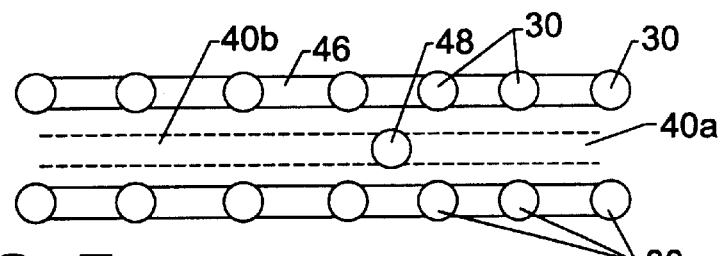
FIG. 7 is a schematic plan view of a multilayer waveguide structure of FIG. 6, and showing a conductive via that intersects a signal path at one level to connect a signal path at another level.
Figure 8:
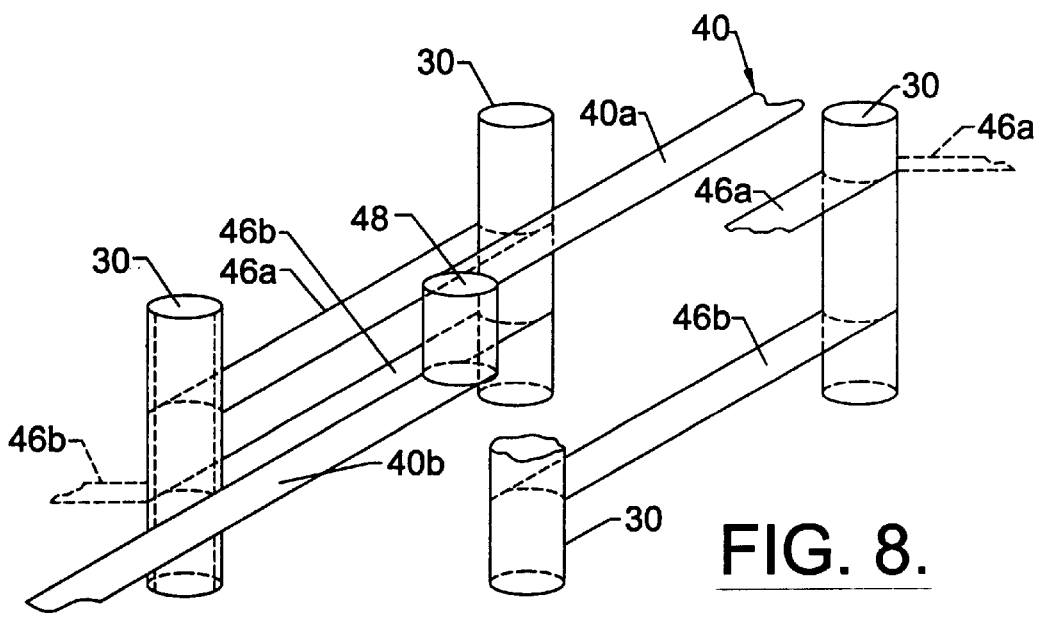
FIG. 8 is a schematic isometric view of the conductive via that can be used in the structure of FIGS. 6 and 7.

As illustrated in FIGS. 6, 7 and 8, it is also possible to form a three dimensional controlled impedance signal track 40 (see FIG. 6, 8) when at least two intermediate signal path layers 42,44 are formed. The two layers 42,44 could be formed by using a third dielectric layer 46 or similar structure as shown in FIG. 6. The structure forms upper and lower controlled impedance signal tracks 40*a*, 40*b* as best seen in FIG. 8 and upper and lower sets of grounding lines 46*a*, 46*b*.

The controlled impedance signal tracks 40*a*, 40*b* and grounding lines 46*a*, 46*b* could be formed by conventional photolithographic techniques known to those skilled in the art (e.g., etching) or additive processes on the layers as described before. It is also possible to use two thin film substrates (not shown) to form the upper and lower controlled impedance signal tracks and upper and lower sets of grounding lines.

As best illustrated in FIGS. 7 and 8, another conductive via 48 is drilled between the grounding lines 46*a*, 46*b* on which the controlled impedance signal track extends so as to connect the controlled impedance signal track 40*b* positioned on a lower intermediate signal path layer 44 onto the upper intermediate signal path layer 42, as shown in FIGS. 6, 7 and 8. Thus, an uninterrupted and shielded waveguide path is formed.

Figure 3:
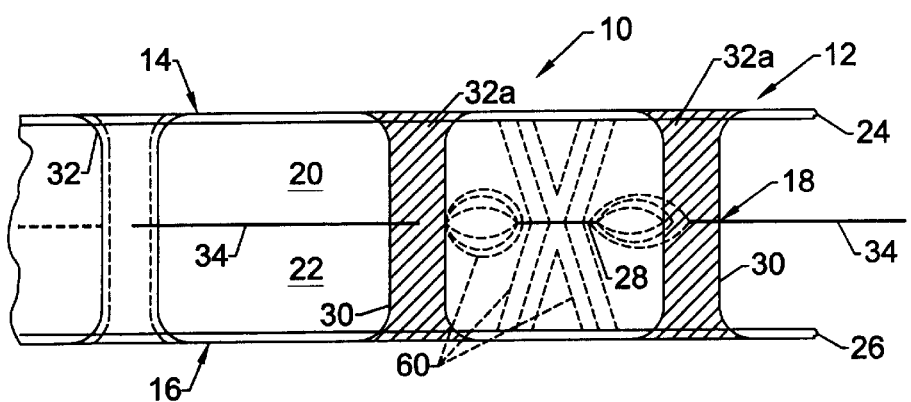
FIG. 3 is a partial side sectional view of the waveguide structure of FIG. 1 and showing the ground planes, conductive vias, and a controlled impedance signal track, and showing schematically the electric lines of force contained by the ground planes and grounding lines.

The waveguide can include edge connectors 50(see FIG. 4) or other connection points to connect the controlled impedance signal tracks to a source of microwave or other radio frequency. The signals pass through the controlled impedance signal tracks located at one or more intermediate signal path layers. The grounding lines can enhance edge grounding to allow waveguide mode rejection. The grounding lines also protect more than one controlled impedance signal track and provide a grounded shield between neighboring circuits formed by the different controlled impedance signal tracks. The sectional view of FIG. 3 illustrates schematically the electric lines of force 60 generated through the controlled impedance signal track, and how the ground planes 24,26, conductive vias, and grounding lines provide the necessary shielding.

It is evident that the present invention is advantageous because printed circuit technology can be used with adequate edge grounding without the more conventional "waffle-line" technology commonly used in production quantities.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A waveguide structure comprising:
   at least two dielectric layers having opposing, substantially outer planar faces and an intermediate signal path layer positioned between said faces;
   a conductive layer disposed on each of said opposing, substantially planar outer faces to define outer ground planes;
   at least one controlled impedance signal track disposed within the waveguide structure at the intermediate signal path layer;
   a plurality of conductive vias interconnecting said ground planes on either side of said at least one controlled impedance signal track and extending through respective ones of said at least two dielectric layers and said plurality of conductive vias being arranged in a grid pattern on either side of said controlled impedance signal track; and
   a plurality of grounding lines interconnecting said vias at said intermediate signal path layer, wherein any one conductive via is connected to all adjacent conductive vias outside said controlled impedance signal track to define an inner grounding line grid that is coplanar with said controlled impedance signal track to work in conjunction with said plurality of conductive vias for waveguide mode rejection.

2. A waveguide structure according to claim 1, wherein said at least two dielectric layers are laminated together, each dielectric layer having a respective ground layer positioned on one side thereof to define said corresponding ground planes.

3. A waveguide structure according to claim 2, wherein said grounding lines are etched connections.

4. A waveguide structure according to claim 2, wherein said at least one controlled impedance signal track is an etched controlled impedance signal track.

5. A waveguide structure according to claim 1, wherein said conductive vias are plated through holes.

6. A waveguide structure according to claim 1, wherein said dielectric layers are comprised of a plastic material.

7. A waveguide structure according to claim 1, and further comprising at least two intermediate signal path layers, wherein one signal track is arranged to cross-over from one intermediate signal path layer to the other intermediate signal path layer.

8. A waveguide structure according to claim 7, and comprising a further plurality of grounding lines interconnecting said vias at each of said intermediate signal path layers.

9. A waveguide structure according to claim 1, and further comprising a continuous edge grounding line disposed adjacent said signal track.

10. A waveguide structure according to claim 1, wherein said conductive vias are positioned to provide said waveguide mode rejection for microwave and millimeter wave frequency ranges.

11. A waveguide structure according to claim 1, wherein said conductive vias are filled with a solid conductive material.

12. A waveguide structure comprising:
    at least two dielectric layers juxtapositioned together and an intermediate signal path layer positioned between the two dielectric layers, wherein each dielectric layer includes a ground layer on a side opposite the other dielectric layer to define opposing ground planes;
    at least one controlled impedance signal track disposed at the intermediate signal path layer;
    a plurality of plated through holes extending through said dielectric layers and interconnecting said ground planes on either side of said at least one controlled impedance signal track and extending through respective ones of said at least two dielectric layers and said plurality of conductive vias being arranged in a grid pattern on either side of said controlled impedance signal track; and
    a plurality of grounding lines arranged at the intermediate signal path layer and interconnecting said plated through holes, wherein any one plated through hole is connected to all adjacent plated through holes outside said controlled impedance signal track to define an inner grounding line grid that is coplanar with said controlled impedance signal track to work in conjunction with said plurality of plated through holes for waveguide mode rejection.

13. A waveguide structure according to claim 12, wherein said grounding lines are etched circuit connections.

14. A waveguide structure according to claim 12, and further comprising means for securing said dielectric layers together.

15. A waveguide structure according to claim 12, wherein said at least one controlled impedance signal track is an etched controlled impedance signal track.

16. A waveguide structure according to claim 12, wherein said dielectric layers are comprised of a plastic material.

17. A waveguide structure according to claim 12, and further comprising a third dielectric layer positioned between said at least two dielectric layers having said ground layers, and including at least two intermediate signal path layers, wherein a signal track is arranged to cross-over from one intermediate signal path layer to the other intermediate signal path layer.

18. A waveguide structure according to claim 17, wherein said plated through holes extend through said third dielectric layer.

19. A waveguide structure according to claim 17, and comprising a further plurality of grounding lines interconnecting said plated through holes at each of said intermediate signal path layers.

20. A waveguide structure according to claim 12, and further comprising a continuous edge grounding line located adjacent to said at least one signal track.

21. A waveguide structure according to claim 12, wherein said plated through holes are positioned to provide said waveguide mode rejection for microwave and millimeter wave frequency ranges.

22. A waveguide structure comprising:
    a substantially planar, multilayer body comprised of at least two dielectric layers and having opposing ground planes;
    at least one controlled impedance signal track disposed within said body between opposing ground planes, said at least one signal track having edge portions;
    a plurality of conductive vias extending through said body on either side of said at least one controlled impedance signal track and extending through respective ones of said at least two dielectric layers and said plurality of conductive vias being arranged in a grid pattern on either side of said controlled impedance signal track and interconnecting said ground planes; and a plurality of grounding lines interconnecting said conductive vias to define a continuous grounding line adjacent an edge of said at least one signal track, wherein any one conductive via is connected to all adjacent conductive vias outside said controlled impedance signal track to define the grounding line arid that is coplanar with said controlled impedance signal track to work in conjunction with said plurality of conductive vias for waveguide mode rejection.

23. A waveguide structure according to claim 22, wherein said at least two dielectric layers further comprises two laminated dielectric layers, each dielectric layer having a respective ground layer positioned on one side thereof to define said opposing ground planes.

24. A waveguide structure according to claim 22, wherein said grounding lines are etched circuit connections.

25. A waveguide structure according to claim 22, wherein said at least one controlled impedance signal track is an etched controlled impedance signal track.

26. A waveguide structure according to claim 22, wherein said conductive vias are plated through holes.

27. A waveguide structure according to claim 22, wherein said dielectric layers are comprised of a plastic material.

28. A waveguide structure according to claim 22, and further comprising at least two intermediate signal path layers, wherein said signal path is arranged to cross-over from one intermediate signal path layer to the other intermediate signal path layers.

29. A waveguide structure according to claim 28, and comprising a further plurality of grounding lines interconnecting said vias at each of said intermediate signal path layers.

30. A waveguide structure according to claim 22, and further comprising a continuous edge grounding line located adjacent said signal path.

31. A waveguide structure according to claim 22, wherein said conductive vias are positioned to provide said waveguide mode rejection for microwave and millimeter wave frequency ranges.

32. A waveguide structure according to claim 22, wherein said conductive vias are filled with a solid conductive material.

33. A waveguide structure comprising:
a substantially planar, multilayer body comprised of at least two dielectric layers having opposing ground planes and at least two intermediate signal path layers;

at least one controlled impedance signal track extending along each of said intermediate signal path layers by crossing over from one signal path layer to another signal path layer;

a plurality of conductive vias extending through said waveguide substrate and interconnecting said ground planes on either side of said at least one controlled impedance signal track and extending through respective ones of said at least two dielectric layers and said plurality of conductive vias being arranged in a grid pattern on either side of said controlled impedance signal track; and a plurality of grounding lines interconnecting said vias at said intermediate signal path layers, wherein any one conductive via is connected to all adjacent vias outside said controlled impedance signal track to define an inner grounding line grid that is coplanar with said intermediate signal path layers for waveguide mode rejection.

34. A waveguide structure according to claim 33, wherein said conductive vias are filled with a solid conductive material.

35. A waveguide structure according to claim 33, wherein said grounding lines are etched circuit connections.

36. A waveguide structure according to claim 35, wherein said conductive vias are plated through holes.

37. A waveguide structure according to claim 33, wherein said at least one controlled impedance signal track is an etched controlled impedance signal track.

38. A waveguide structure according to claim 33, wherein said dielectric layers are comprised of a plastic material.

39. A waveguide structure according to claim 33, and further comprising a continuous edge grounding line located adjacent said signal path.

40. A waveguide structure according to claim 33, wherein said conductive vias are positioned to provide said waveguide mode rejection for microwave and millimeter wave frequency ranges.

41. A method of forming a waveguide structure comprising the steps of:
forming a controlled impedance signal track on an intermediate signal path layer;

forming a grid of grounding lines on the intermediate signal path layer such that the grid of grounding lines extends outside the signal path on either side of said at least one controlled impedance signal track and forming a grid pattern on either side of said controlled impedance signal track;

positioning first and second outer dielectric layers in juxtaposition to the intermediate signal path layer such that the first and second dielectric layers form a waveguide structure, wherein the outer dielectric layers each include an outer ground layer forming a ground plane; and forming a plurality of conductive vias within the formed waveguide substrate and which extend through the respective dielectric layer and corresponding intermediate signal path layer and interconnect the ground planes, wherein the conductive vias are formed to extend through an intersection of the grounding lines, wherein any one conductive via is connected to all adjacent conductive vias outside said controlled impedance signal track to define the grounding line grid that is coplanar with said controlled impedance signal track to work in conjunction with said plurality of conductive vias for waveguide mode rejection.

42. The method according to claim 41, and further comprising the step of positioning at least a third dielectric layer between the outer dielectric layers, and forming a multilayer signal path.

43. The method according to claim 41, and further comprising the step of forming the grounding lines by etching circuit connections.

44. The method according to claim 41, and further comprising the step of forming the intermediate signal path layer by an etching process.

45. The method according to claim 41, and further comprising the step of forming the conductive vias by forming plated through holes.

46. The method according to claim 45, and further comprising the step of filling the holes with a solid conductive material.

47. The method according to claim 41, and further comprising the step of forming a continuous edge grounding line about the signal track.

48. The method according to claim 41, and further comprising the step of spacing an intersection of the grounding lines to provide waveguide mode rejection for microwave and millimeter wave frequency ranges.

* * * * *

UNITED STATES PATENT AND TRADEMARK OFFICE
CERTIFICATE OF CORRECTION

PATENT NO. : 6,072,375
DATED : June 6, 2000
INVENTOR(S) : Adkins, et. al.

It is certified that error appears in the above-indentified patent and that said Letters Patent is hereby corrected as shown below:

Column 9, line 8    Delete: "arid"

Substitute: -- grid --

Signed and Sealed this

Twentieth Day of March, 2001

Attest:

NICHOLAS P. GODICI

Attesting Officer    Acting Director of the United States Patent and Trademark Office